United States Patent [19]
Tamakoshi et al.

[11] Patent Number: 4,769,612
[45] Date of Patent: Sep. 6, 1988

[54] INTEGRATED SWITCHED-CAPACITOR FILTER WITH IMPROVED FREQUENCY CHARACTERISTICS

[75] Inventors: Masashi Tamakoshi, Kokubunji; Toshiro Suzuki, Tama; Hiroshi Takatori, Kokubunji, all of Japan

[73] Assignee: Hitachi, Ltd., Tokyo, Japan

[21] Appl. No.: 110,574

[22] Filed: Oct. 15, 1987

Related U.S. Application Data

[63] Continuation of Ser. No. 15,750, Feb. 17, 1987, which is a continuation of Ser. No. 640,448, Aug. 13, 1984, abandoned.

[30] Foreign Application Priority Data

Nov. 18, 1983 [JP] Japan .................................. 58-216144

[51] Int. Cl.$^4$ ........................ H03H 19/00; H03K 5/00
[52] U.S. Cl. .................................. 328/167; 307/520; 333/173; 328/151
[58] Field of Search ........................ 328/167, 151, 155; 307/520, 521, 491; 333/173, 213; 330/9, 107, 109

[56] References Cited

PUBLICATIONS

Mohan et al., "General Stray–Insensitive First-Order Active Network," Elec. Letters, 1-7-82, vol. 18, No. 1, pp. 1-2.

*Primary Examiner*—Stanley D. Miller
*Assistant Examiner*—Timothy P. Callahan
*Attorney, Agent, or Firm*—Antonelli, Terry & Wands

[57] ABSTRACT

A switched-capacitor filter constituted in the form of a semiconductor integrated circuit has an input circuit which consists of at least one noninversion-type switched-capacitor and at least two inversion-type switched-capacitors that are connected in parallel with each other. The two inversion-type switched-capacitors have different writing timings and reading timings relative to each other. With this setup, capacitances of the switched-capacitors need not be extremely increased even when it is desired to maintain a zero-point frequency of the filter at a very low value. Further, there is no need of providing a circuit such as sample holding circuit which requires extra area and consumes additional electric power.

18 Claims, 4 Drawing Sheets

INTEGRATED SWITCHED-CAPACITOR FILTER WITH IMPROVED FREQUENCY CHARACTERISTICS

This application is a continuation of application Ser. No. 015,750, filed on Feb. 17, 1987, which application is a continuation application of Ser. No. 640,448, filed on Aug. 13, 1984, now abandoned.

BACKGROUND OF THE INVENTION

The present invention relates to semiconductor integrated circuits. More specifically, the invention relates to a technique that can be effectively adapted to structure of an active filter, such as structure of a switched-capacitor filter in a semiconductor integrated circuit which contains a filter circuit.

Filters used for transmission lines have developed from LC filters employing individual parts to RC active filters employing operational amplifiers. In recent years, switched-capacitor filters are used in which a resistance element in the active filter has been replaced by a switch and a capacitor.

When an active filter having desired frequency characteristics is to be designed, in general, a transfer function is first found which satisfies the desired filter characteristics, the transfer function is decomposed into a primary or a secondary rational expression, a basic block is designed which realizes the characteristics for the rational expression, and the basic blocks are connected in cascade.

In designing the switched-capacitor filter, a Z-function is used to express the transfer function instead of using a Laplace-transformed S-function. The relation between the Z-function and the S-function is represented by $Z = e_{ST}$ (e=natural logarithm, T; sampling period). If S is replaced by $J\omega$ ($\omega$: angular velocity) to express the relationship in terms of a complex number, the relation is represented by $Z = e^{j\omega t}$.

As primary switched capacitor filters that realize characteristics given by a transfer function $H(Z) = (C + DZ^{-1})/(A + BZ^{-1})$ represented by the Z-function, circuits have already been proposed as shown in FIGS. 1 and 2 (IEEE, Solid-state circuits, Vol. SC-14, No. 6, December, 1979, pp. 1020-1033, MOS Switched-Capacitor Analog Sampled Data Direct Form Recursive Filters, Ian A. Young; ISCAS, 1980, General Active Switched-Capacitor Biquad Topology For Precision MOS Filters, K. R. Laker, pp. 304-308).

In the circuit form shown in FIG. 1, however, if the individual capacitors are denoted by $C_0$, $C_1$, $C_2$ and $C_5$, a charge transfer equation at a moment (nT) at which the individual switches are under the condition shown in FIG. 1, is given by, $$-[\{V_1(nT) - V_1(n-1)T\} \cdot C_1 + V_1(nT) \cdot C_2] + \quad (1)$$
$$V_2\{(n-1)T\} C_0 = (C_5 + C_0) \cdot V_2(nT)$$

If the charge transfer equation is subjected to the Z-conversion to find the transfer function H(Z), the following equation (2) is obtained, i.e., $$H(Z) = V_2/V_1 = \{(C_1C_2) - C_1 \cdot Z^{-1}\}/\{(C_5 + C_0) - C_0 \cdot Z^{-1}\} \quad (2)$$

It will therefore be understood that the coefficients A to D in the general equation $H(Z) = (C + DZ^{-1})/(A + BZ^{-1})$ of the transfer function of the primary filter are given as $A = C_5 + C_0$, $B = -C_0$, $C = C_1 + C_2$, $D = -C_1$.

In the circuit form of FIG. 1, therefore, when it is desired to realize a filter which has characteristics with a very low so-called zero point (frequency at which the numerator of the transfer function becomes zero), it is necessary to bring C/D, i.e., to bring $(C_1 + C_2)/C_1$ to approximately "1". Here, to bring $(C_1 + C_2)/C_1$ close to "1" means that the capacitance $C_2$ must be reduced to be very much smaller than the capacitance $C_1$. In semiconductor integrated circuits, however, a limitation is imposed on reducing the area of capacitors as determined by a minimum processable dimension in the manufacturing process. To bring $(C_1 + C_2)/C_1$ to "1", therefore, the capacitance $C_1$ must be increased to be very much larger than the capacitance $C_2$.

In the circuit employing a filter of the form shown in FIG. 1, therefore, the capacitor $C_1$ occupies an increased area, and the chip size increases. Further, load capacitance increases for the operational amplifier that forms the input signal $V_1$ in the preceding stage, which is not shown. Therefore, the operational amplifier $OP_1$ operates at a decreased speed, and consumes an increased amount of electric power.

If the ratio of capacitor $C_1$ to capacitor $C_2$ is decreased to decrease the area, frequency characteristics of the filter deteriorate, and accuracy decreases.

In the case of the circuit of FIG. 2, switches $S_{31}$, $S_{32}$ coupled to the capacitor $C_3$ operate at a timing deviated by a half period relative to switches $S_{41}$, $S_{42}$ coupled to the capacitor $C_4$, as shown in FIG. 3. Therefore, data of a half period ago is stored in the capacitor $C_4$.

In the circuit form of FIG. 2, therefore, the following charge transfer equation (3) holds true:

$$-[V_1(nT) \cdot C_3 - V_1\{(n - \tfrac{1}{2})T\} \cdot C_4] + \quad (3)$$
$$V_2\{(n - 1)T\} \cdot C_0 = V_2(nT) \cdot (C_0 + C_5)$$

If the equation (3) is subjected to the Z-conversion to find a transfer function H(Z), the following equation (4) is obtained:

$$H(Z) = (C_3 - C_4 \cdot Z^{-\tfrac{1}{2}})/\{(C_0 + C_5) - C_0 Z^{-1}\} \quad (4)$$

where $Z^{-1}$ and $Z^{-\tfrac{1}{2}}$ denote operators that mathematically represent data (quantities of analog signals) of one period ago and a half period ago.

In the equation (3), if it is presumed that $V_1\{(n-\tfrac{1}{2})T\} = V_1\{(n-1)T\}$, an equation (5) of the form of primary/primary is obtained, i.e., $$H(Z) = -(C_3 - C_4 \cdot Z^{-1})/\{(C_0 + C_5) - C_0 \cdot Z^{-1}\} \quad (5)$$

If it is attempted to realize a filter having the circuit form shown in FIG. 2 with characteristics having a low zero point as described above, $C_3/C_4$ must be brought close to "1" as will be understood from the equation (5). This can be accomplished relatively easily; i.e., $C_3 = C_4$ should be realized. Unlike the circuit form of FIG. 1, the ratio of capacitances does not become large, and the chip size does not increase, either.

Here, the above-mentioned presumption $V_1\{(n-\tfrac{1}{2})T\} = V_1\{(n-1)T\}$ has a meaning that the data of one period ago must be equal to the data of a half period ago. With the circuit form of FIG. 2, however, the above requirement does not hold true. To satisfy the above presumption, therefore, it is necessary to provide a sample holding circuit in a stage preceding the circuit of FIG. 2 to hold the data of one period ago up to the moment of a half period ago.

However, the sample holding circuit is constituted by using, for example, a switched-capacitor and an operational amplifier. This means that the substrate constituting a semiconductor integrated circuit requires additional area for the sample holding circuit, resulting in the increase in power consumption, too. For instance, when a tertiary filter is to be constituted by using the circuit of FIG. 2, the area occupied by the sample holding circuit and the power consumption thereof become as large as about one-fourth the whole values.

SUMMARY OF THE INVENTION

The object of the present invention is to provide technique for semiconductor integrated circuits, which exhibits distinguished effects over the conventional art.

Another object of the present invention is to provide a switched-capacitor filter which occupies reduced area when it is adapted to a semiconductor integrated circuit, enabling the chip size to be decreased and the consumption of electric power to be reduced, too.

A further object of the present invention is to provide a switched-capacitor filter which features good frequency characteristics and high accuracy.

The above-mentioned objects, other objects and novel features of the present invention will become apparent from the description of the specification and the accompanying drawings.

A representative example of the invention disclosed in the specification is summarized below.

Namely, in a switched-capacitor filter constructed in the form of a semiconductor integrated circuit, an input circuit consists of two inversion-type switched-capacitors and one noninversion-type switched-capacitor that are connected in parallel. Here, at least the inversion-type switched-capacitors are operated by sampling clock pulses of a doubled period. This makes it possible to hold the data of one period ago in the input circuit without using a sample holding circuit. The thus held data is transferred to a feedback capacitor together with the data that is delayed by one period. Accordingly, it is possible to obtain a primary basic filter which realizes filter characteristics having a low zero point without the need of increasing the capacitance ratio in the input circuit. According to this structure, the above-mentioned objects can be achieved; i.e., chip size can be reduced, and the consumption of electric power can be reduced.

DESCRIPTION OF THE PREFERRED EMBODIMENTS

[Embodiment 1]

Figure 4:
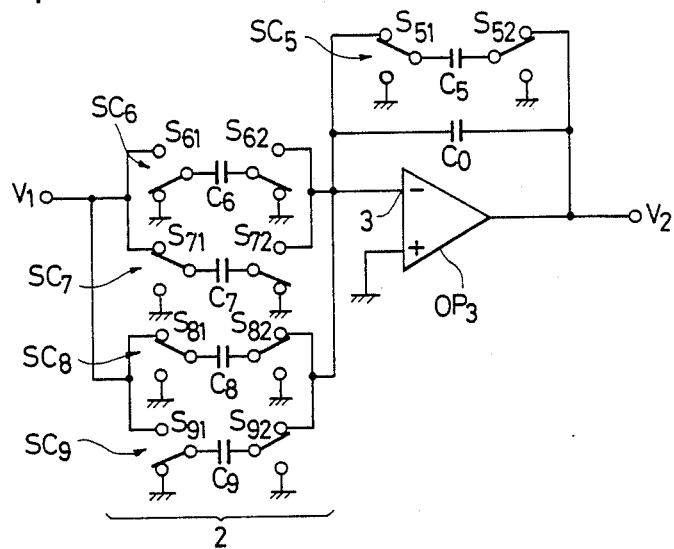
FIG. 4 is a circuit diagram of a first embodiment in which the present invention is adapted to a primary filter.

FIG. 4 shows an embodiment of a primary/primary filter to which the present invention is adapted.

The circuit of this embodiment and other embodiments that will be described later, are formed on a semiconductor substrate by the technique of CMOS integrated circuits.

In the following description, the word "switched-capacitor" represents a unit circuit which consists of a capacitor and switch elements coupled thereto, or a circuit consisting of a combination of a plurality of such unit circuits.

In this embodiment, an input circuit 2 consisting of two noninversion-type switched-capacitors $SC_6$, $SC_8$, and two inversion-type switched-capacitors $SC_7$, $SC_9$ connected in parallel, is connected between an input terminal 1 and an inverted input terminal 3 of an operational amplifier $OP_3$.

Here, the inversion-type switched-capacitor represents the one in which an electric charge having an absolute value equal to that charged in the capacitor but having a polarity (+ or −) opposite to that charged in the capacitor, is transferred to a feedback capacitor $C_0$ of the next stage. The noninversion-type switched-capacitor represents the one in which the electric charge stored in the capacitor is directly transferred to the feedback capacitor $C_0$. Capacitors $C_6$, $C_8$ in the switched-capacitors $SC_6$, $SC_8$ have the same capacitance relative to each other, and the capacitors $C_7$, $C_9$ also have the same capacitance relative to each other.

In FIG. 4, the switches $S_{51}$ to $S_{92}$ are to be denoted by a symbol of a change-over switch to simplify the drawing. In practice, these switches are constituted by MOSFET's formed by the technique of integrated circuit. In this case, unit single-throw switches are constituted by the individual MOSFET's. Therefore, the switches shown in FIG. 4 are constituted by a plurality of MOSFET's.

As will be mentioned later, among the switches $S_{51}$ to $S_{92}$, the switches $S_{51}$ to $S_{62}$, $S_{81}$ and $S_{82}$ in the noninversion-type switched-capacitors $SC_5$, $SC_6$ and $SC_8$, are allowed to have a switching condition like that of the snap switch.

In contrast, the switches $S_{71}$, $S_{72}$, $S_{91}$ and $S_{92}$ in the inversion-type switched-capacitors $SC_7$ and $SC_9$, are allowed to establish an open condition, i.e., a condition in which one of the three terminals make electric conductivity.

In the following description, the switching conditions of the switches are termed as mentioned below for the purpose of convenience.

Namely, the condition in which the switches are as shown in FIG. 4 is referred to as a first switching condition, and the condition in which the switches are inverted relative to the condition of FIG. 4 is referred to as a second switching condition. The open condition of switches $S_{71}$, $S_{72}$, $S_{91}$ or $S_{92}$ is referred to as open condition.

The operational amplifier $OP_3$ of FIG. 4 consists of a differential amplifier circuit which has an inverted input terminal—and a noninverted input terminal +. In the case of the operational amplifier consisting of a differential amplifier circuit, it can be considered that the inverted input terminal and the noninverted input terminal are under the imaginary short-circuited condition, and operation of the whole circuit can be easily comprehended. However, the term "operational amplifier" does not exclusively represent an amplifier circuit with a pair of input terminals, such as a differential amplifier circuit. If necessary, the operational amplifier $OP_3$ shown in FIG. 4 may be constituted by an inverter circuit having an output terminal and an input terminal that can be regarded as an inverted input terminal, or may be constituted by a plurality of inverter circuits that are connected in cascade. In this case, for the purpose of easy comprehension of the circuit operation, it can be so considered that the inverter circuit has an input terminal as well as an imaginary noninverted input terminal.

With reference to a noninversion-type switched-capacitor, for example, the noninversion-type switched-capacitor $SC_6$ of FIG. 4, an electric charge proportional to an input $V_1$ is written into the capacitor $C_6$ when the switches $S_{61}$, $S_{62}$ establish the second switching condition. In the noninversion-type switched-capacitor, the electric charge written into the capacitor therein is directly transferred to an output terminal. In the noninversion-type switched-capacitor, therefore, writing of signal and reading of signal are executed simultaneously.

With reference to an inversion-type switched-capacitor, for example, the switched-capacitor $SC_7$, on the other hand, an electric charge proportional to the input $V_1$ is written into the capacitor $C_7$ when the switches $S_{71}$, $S_{72}$ establish the first switching condition as shown in FIG. 4. The electric charge of the capacitor $C_7$ is supplied to the inverted input terminal of the operational amplifier $OP_3$, when the switches $S_{71}$, $S_{72}$ establish the second switching condition. In the inversion-type switched-capacitor, therefore, writing of signal and reading of signal are executed independently of each other.

FIGS. 5A to 5E are operation timing charts of the switches. Solid lines in FIGS. 5A to 5E represent writing timings of the switched-capacitors. Broken lines of FIGS. 5C to 5E represent reading timings of the inversion-type switched-capacitors.

In the primary/primary filter of this embodiment as will be obvious from the timing chart of FIGS. 5A to 5E, if switches $S_{51}$, $S_{52}$ of the feedback switched-capacitor $SC_5$ are operated by sampling clock pulses of a reference period $T_0$, then the switches $S_{61}$, $S_{62}$ to $S_{91}$, $S_{92}$ of the switched-capacitors $SC_6$ to $SC_9$ constituting the input circuit 2, are operated by sampling clock pulses of a period $2T_0$ which is two times as long as the reference period $T_0$.

The switches $S_{61}$, $S_{62}$ and $S_{81}$, $S_{82}$, and the switches $S_{71}$, $S_{72}$ and $S_{91}$, $S_{92}$, are operated by sampling clock pulses that are deviated by one period relative to one another as will be obvious from the comparison of FIGS. 5B to 5E. In this case, furthermore, the switches $S_{71}$, $S_{72}$ and the switches $S_{81}$, $S_{82}$ are operated at the same timing, and the switches $S_{61}$, $S_{62}$ and $S_{91}$, $S_{92}$ are operated at the same timing.

Figure 5:
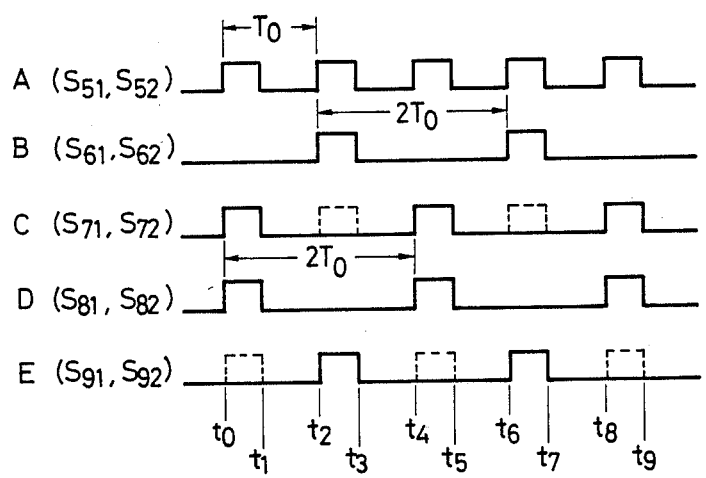
FIG. 5 is a timing chart illustrating operation timings of the circuit of FIG. 4.

Therefore, the electric charge proportional to the input signal $V_1$ is supplied to the capacitors $C_6$ to $C_9$ of the input circuit 2 at timings shown in FIG. 5. That is, the capacitor $C_6$ is coupled between the input terminal $V_1$ and the inverted input terminal of the operational amplifier $OP_3$ as the switches $S_{61}$, $S_{62}$ assume the second switching condition at a time $t_2$. Therefore, the electric charge proportional to the input signal $V_1$ is supplied to the capacitor $C_6$. The electric charge stored in the capacitor $C_6$ is transferred to the feedback capacitor $C_0$ at the same timing. As the switches $S_{61}$, $S_{62}$ assume the first switching condition at a time $t_3$, the electric charge stored in the capacitor $C_6$ is discharged (reset) via the switches $S_{61}$, $S_{62}$.

The capacitor $C_8$ is charged and discharged according to a timing chart of FIG. 5D.

The capacitor $C_7$ is coupled between the input terminal $V_1$ and ground point of the circuit when the switches $S_{71}$ and $S_{72}$ assume the first switching condition at a time $t_0$. Therefore, the electric charge proportional to the input signal $V_1$ is supplied to the capacitor $C_7$. The switches $S_{71}$ and $S_{72}$ are opened during a period between the time $t_1$ and the time $t_2$. The switches $S_{71}$, $S_{72}$ further assume the second switching condition at the time $t_2$. Therefore, the electric charge which has been written into the capacitor $C_7$ beforehand is transferred to the feedback capacitor $C_0$. Namely, the electric charge written into the capacitor $C_7$ is transferred to the feedback capacitor $C_0$ at a timing delayed by one period of clock pulse behind the timing for writing.

Similarly, the electric charge written into the capacitor $C_9$ at the time $t_2$ is transferred to the feedback capacitor $C_0$ at a time $t_4$ which is delayed by one period behind the time $t_2$.

Figure 2:
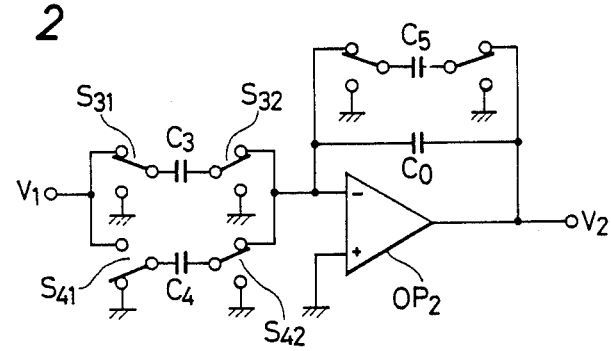
FIG. 2 is a circuit diagram showing the structure of another conventional primary filter.
Figure 3:
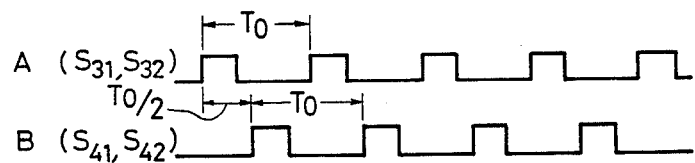
FIG. 3 is a timing chart illustrating operation timings of switches in the switched-capacitors in the filter circuit of FIG. 2.

In the circuit of this embodiment, a pair of switched-capacitors $SC_6$ and $SC_7$, and another pair of switched-capacitors $SC_8$ and $SC_9$ are alternatingly operated after every other period, to produce the same function as that of the filter circuit of FIG. 2 in which provision is made of a sample holding circuit in a prestage to hold the data of one period ago for a half period, and the switched-capacitor $SC_4$ is operated being deviated by a half period with respect to the switched-capacitor $SC_3$.

Charge transfer equations at times $nT$ and $(n+1)T$ of the filter circuit of FIG. 4 are as given below:

$$-V_1(n)\cdot C_8 + V_1(n-1)\cdot C_9 + V_2(n-1)\cdot C_0 = V_2(n)\cdot (C_5 + C_0) \tag{6}$$

$$-V_1(n+1)\cdot C_6 + V_1(n)\cdot C_7 + V_2(n)\cdot C_0 = V_2(n+1)\cdot (C_5 + C_0) \tag{7}$$

In this embodiment, although there is no particular limitation, the capacitance $C_8$ is selected to be equal to the capacitance $C_6$, and the capacitance $C_9$ is selected to be equal to the capacitance $C_7$. Therefore, the charge transfer equations (6) and (7) become equal to each other at times $nT$ and $(n+1)T$. Namely, either one of the equation (6) or (7) needs be solved to find a transfer function.

It is now attempted to find a transfer function $H(Z)$ by subjecting the charge transfer equation at the time $nT$ to the Z-conversion. If the equation (6) is subjected t the Z-conversion, the following equation (8) is obtained, $$V_1(-C_8 + Z^{-1}C_9) = V_2(C_5 + C_0 - Z^{-1}C_0) \tag{8}$$

The following equation (9) is obtained from the equation (8), $$H(Z) = V_2/V_1 = -(C_8 - Z^{-1}\cdot C_9)/\{(C_5 + C_0) - Z^{-1}\cdot C_0\} \tag{9}$$

The transfer function represented by the equation (9) assumes the same form as the transfer function found for the circuit of FIG. 2. From this transfer function, a circuit having filter characteristics with low zero point can be designed if the numerator in the above equation is set to the zero. Namely, $C_8/C_9=1$ should be accomplished. This can be easily realized by setting the capacitance $C_8$ to be equal to the capacitance $C_9$.

Thus, according to the circuit of FIG. 4, the term $Z^{-\frac{1}{2}}$ in the numerator of the transfer function can be eliminated without using a sample holding circuit that was provided for the circuit of FIG. 2. Accordingly, a filter having characteristics with low zero point can be realized by bringing the capacitance ratio to "1". Since capacitances of the capacitors need not be abnormally increased, the capacitors can be formed in reduced sizes compared with those of the circuit of FIG. 1; i.e., areas occupied by the circuit can be reduced to decrease the chip size. The circuit establishes a small capacitive load relative to the operational amplifier of the preceding stage and, hence, the operational amplifier $OP_3$ operates at an increased speed.

Figure 1:
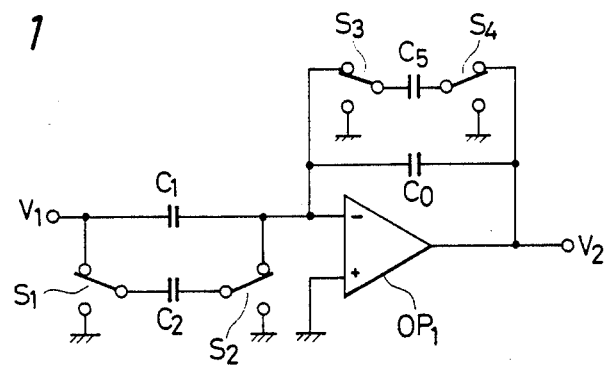
FIG. 1 is a circuit diagram showing the structure of a conventional primary filter.

In the circuit of FIG. 1 as described earlier, the ratio of capacitance $C_1$ to capacitance $C_2$ must be reduced to restrain the occupied area within a predetermined range, resulting in deteriorated filter characteristics and decreased accuracy. With the filter circuit of the above-mentioned embodiment, on the other hand, the capacitance ratio can be determined responsive to desired filter characteristics, such that the filter characteristics are improved and accuracy increases.

According to the circuit of the above-mentioned embodiment which does not require the sample holding circuit, furthermore, the area occupied by the sample holding circuit and the consumption of electric power can be reduced compared with those of the circuit of FIG. 2. For instance, when a tertiary filter is constituted by using the circuit of FIG. 4, the occupied area and the power consumption can be reduced by about 25% compared with the case of using the circuit of FIG. 2.

In this embodiment, clock pulses must be prepared by dividing into one-half the frequency of the reference clock pulses in order to operate the switched-capacitors $SC_6$ to $SC_9$, resulting in the increase in the kinds of clock pulses compared with those of the circuit of FIG. 1. The circuit of FIG. 2, however, requires two kinds of clock pulses having phases that are deviated by one-half period relative to one another. Therefore, this embodiment does not require increased kinds of clock pulses compared with those of the circuit of FIG. 2.

[Embodiment 2]

Figure 6:
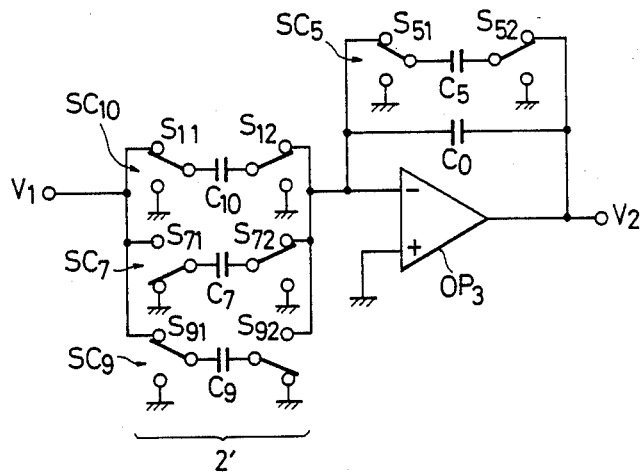
FIG. 6 is a circuit diagram of a second embodiment in which the present invention is adapted to the primary filter.
Figure 7:
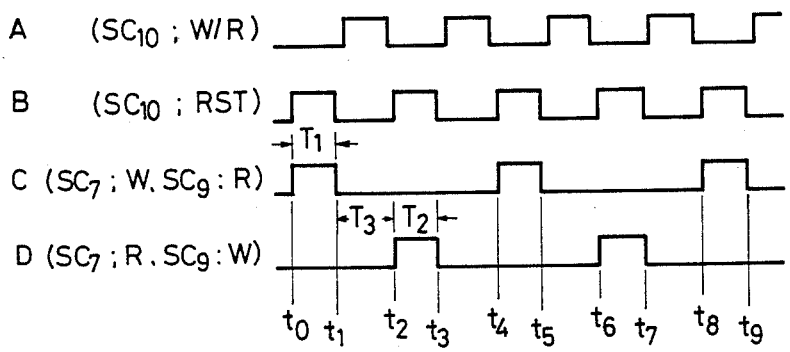
FIG. 7 is a timing chart illustrating operation timings of switches in the switched-capacitors.

FIGS. 6 and 7 illustrate a second embodiment of the present invention.

According to this embodiment, one switched-capacitor performs a circuit operation which, according to the first embodiment, was performed by two noninversion-type switched-capacitors $SC_6$, $SC_8$. The two switched-capacitors can be replaced by one switched-capacitor because of the reasons described below. That is, in the first embodiment, the noninversion-type switched capacitors $SC_6$ and $SC_8$ connected in parallel are alternatingly operated after every other period. Therefore, when the capacitances $C_6$, $C_8$ are to be equalized to each other, the switched-capacitors $SC_6$ and $SC_8$ can be replaced by a noninversion-type switched-capacitor that operates at a one-half period.

In the input circuit 2' of the second embodiment, the switched-capacitors $SC_6$, $SC_8$ employed in FIG. 4 have been replaced by a switched-capacitor $SC_{10}$ which operates at a one-half period of the inversion-type switched-capacitors $SC_7$, $SC_9$ according to a timing chart of FIG. 7. Therefore, the filter circuit of FIG. 6 operates quite in the same manner as that of FIG. 4, and produces the same functions and effects.

In FIG. 6, the switches $S_{11}$, $S_{12}$, $S_{71}$, $S_{72}$, $S_{91}$ and $S_{92}$ constituting the switched-capacitors $SC_{10}$, $SC_7$ and $SC_9$ are represented by a symbol of a change-over switch like that of FIG. 4, in order to simplify the drawing. However, the individual switches are allowed to assume the open condition. Therefore, it should be so comprehended that each switch consists of two single-throw switches that can be controlled independently of each other.

Switching conditions of each of the switches can be understood from the timing charts of FIGS. 7A to 7D. FIG. 7A shows a timing at which the switches $S_{11}$, $S_{12}$ are connected to the input terminal 1 and to the inverted input terminal of the operational amplifier $OP_3$ of FIG. 6. In other words, FIG. 7A shows a timing at which the writing and reading operation of the switched-capacitor $SC_{10}$ is performed. FIG. 7(B) shows a timing at which the switches $S_{11}$, $S_{12}$ are connected to the ground side, i.e., shows a timing at which the electric charge of the capacitor $C_{10}$ is discharged. FIG. 7(C) shows a timing at which the switches $S_{71}$, $S_{92}$ are connected to the input terminal 1 and to the inverted input terminal of the operational amplifier, and the switches $S_{72}$, $S_{91}$ are connected to the ground side. In other words, FIG. 7C shows a timing at which the electric charge is written into the switched-capacitor $SC_7$ and the electric charge is read out from the switched-capacitor $SC_9$. FIG. 7D shows a timing at which the switches $S_{71}$, $S_{92}$ are connected to the ground side, and the switches $S_{72}$, $S_{91}$ are connected to the inverted input terminal of the operational amplifier and to the input terminal 1. In other words, FIG. 7D shows a timing at which the electric charge is read out from the switched-capacitor $SC_7$ and the electric charge is written into the switched capacitor $SC_9$.

In a period $T_3$ between the times $T_1$ and $T_2$ for connecting the switches shown in FIGS. 7C and 7D, the switches $S_{71}$, $S_{72}$ and $S_{91}$, $S_{92}$ are all floated (i.e., connected to none of the terminals). Electric charges stored in the capacitors $C_7$, $C_9$ are held during this period $T_3$. This condition can be realized by constituting each of the switches $S_{71}$, $S_{72}$, $S_{91}$ and $S_{92}$ using a pair of MOSFET's, and rendering both of the MOSFET's non-conductive simultaneously.

[Embodiment 3]

Figure 8:
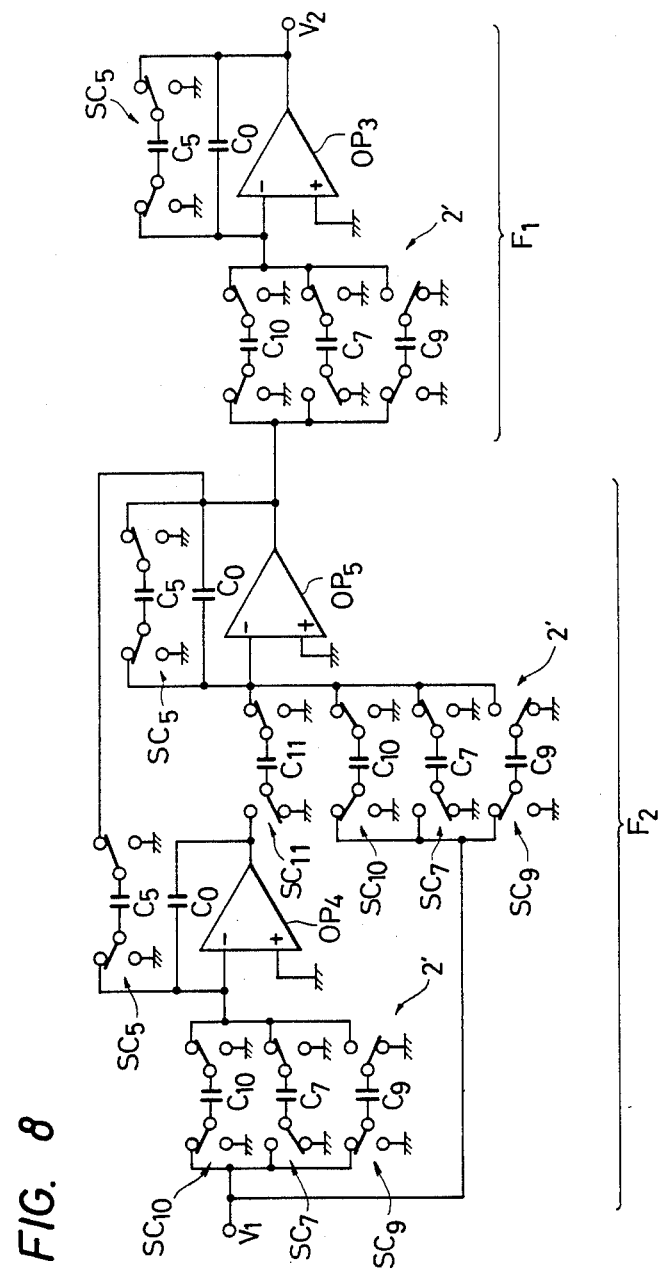
FIG. 8 is a circuit diagram of an embodiment in which the present invention is adapted to a tertiary filter circuit.

FIG. 8 illustrates a third embodiment of the present invention. The circuit of this embodiment consists of a secondary/secondary filter $F_2$ and a primary/primary filter $F_1$ that are connected in series, and constitutes a tertiary filter as a whole.

The filter $F_2$ consists of two primary/primary filters of FIG. 6 that are connected together via a switched-capacitor $SC_{11}$. A feed-forward is applied from the input of the preceding stage to the input of the subsequent stage, and a feedback is applied from the output of the subsequent stage to the input of the preceding stage. The filter $F_1$ consists of the primary/primary filter which is shown in FIG. 6.

That is, input circuits 2' each consisting of inversion-type switched-capacitors SC$_7$, SC$_9$ and a non-inversion-type switched-capacitor SC$_{10}$ connected in parallel, are connected to the inverted input terminals of each of the operational amplifiers OP$_3$ to OP$_5$. In the input circuit 2', the switched-capacitor SC$_{10}$ is operated at a period of reference clock pulses, and the switched-capacitors SC$_7$, SC$_9$ are operated by clock pulses of a period that is two times as long as that of the reference clock pulses. Therefore, the term $Z^{-\frac{1}{2}}$ can be eliminated from the numerator of the transfer function without the need of providing the sample holding circuit. Accordingly, filter characteristics having a low zero point can be realized with capacitors of small capacitance ratios.

The input circuit 2' of FIG. 8 may be replaced by the input circuit 2 consisting of a pair of noninversion-type switched-capacitors SC$_6$, SC$_8$ and a pair of inversion-type switched-capacitors SC$_7$, SC$_9$ shown in FIG. 4.

It is further possible to connect the secondary filter F$_2$ of FIG. 8 in a plurality of numbers in cascade to constitute a filter circuit of the order of 2n (n is an integer), or to connect the secondary filter in a number n and one primary filter in cascade to constitute a filter circuit of the order of (2n+1).

In the embodiment of FIG. 4, two pairs of non-inversion-type switched-capacitors and inversion-type swtiched-capacitors are provided in parallel to constitute an input circuit that operates at a doubled period, thereby to realize a primary/primary filter of which the numerator of transfer function is represented by $C+DZ^{-1}$. It is further allowable to connect three or more pairs of the noninversion-type swtiched-capacitors and the inversion-type switched-capacitors in parallel to operate them at tripled period, quadrupled period, or the like, in order to realize a transversal filter that can be represented by $C+D_1Z^{-1}+D_2Z^{-2}+D_3Z^{-3}+$. By using such a transversal filter, the delay time can be flattened, and the time axis can be easily designed.

[Effects]

(1) An input circuit consisting of a plurality of inversion-type switched-capacitors and at least one noninversion-type switched-capacitor connected in parallel, is connected to one input terminal of an operational amplifier, and at least the inversion-type switched-capacitors are alternatingly operated being deviated by one period relative to one another at a period twice that of the reference clock pulses. Therefore, the data of one period ago is stored without using the sample holding circuit, and is transferred to the feedback capacitor together with the data that is delayed by one period, making it possible to realize filter characteristics having a low zero point without the need of increasing the capacitance ratio on the input circuit. Thus, reduced area is occupied by the filter, the chip size is reduced, and the consumption of electric power is reduced.

(2) An input circuit consisting of a plurality of inversion-type switched-capacitors and at least one noninversion-type switched-capacitor connected in parallel, is connected to one input terminal of an operational amplifier, and at least the inversion-type switched-capacitors are alternatingly operated being deviated by one period relative to one another at a period twice that of the reference clock pulses. Therefore, it is possible to realize filter characteristics having a low zero point without the need of increasing the capacitance ratio in the input circuit. This enables the frequency characteristics of the filter to be improved and the accuracy to be enhanced compared with those in which limitation is imposed on the capacitance ratios.

The invention accomplished by the inventors was concretely described above by way of embodiments. It should, however, be noted that the invention is in no way limited to the above-mentioned embodiments only, but can be modified in a variety of other way without departing from the scope of the invention.

[Field of Utilization]

The present invention can be utilized for all semiconductor integrated circuit devices containing switched-capacitor filters, such as equalized LSI's (equalizers) for digital telephone equipment, $\sqrt{f}$ equalizers, and LSI's for processing picture and voice signals.

We claim:

1. A semiconductor integrated circuit comprising:
an input node for receiving an input signal;
operational amplifier means having an input terminal and an output terminal;
a first inversion-type switched-capacitor and a second inversion-type switched-capacitor that are coupled in parallel between said input node and said input terminao, wherein said first inversion-type switched-capacitor includes a first capacitor and said second inversion-type switched-capacitor includes a second capacitor having a substantially equal capacitance to said first capacitor, and wherein a charge proportional to the input signal is written in each of said first and second capacitors in a writing operation thereof, and wherein each of said first and second capacitors provides a charge of opposite polarity to that written therein to said input terminal in a read-out operation thereof;
a first noninversion-type switched-capacitor and a second noninversion-type switched-capacitor that are coupled in parallel between said input node and said input terminal, wherein said first noninvernsion-type swithced-capacitor includes a third capacitor and said second noninvernsion-type switched-capacitor includes a fourth capacitor having a substantially equal capacitance to said third capacitor, and wherein a charge proportional to the input signal is written into each of said third and fourth capacitors in a writing operation thereof, and wherein each of said third and fourth capacitors provides a charge of the same polarity as that written therein to said input terminal in a read-out operation thereof; and
a third noninvernsion-type switched-capacitor coupled between said input terminal and said output terminal, said third noninvernsion-type switched-capacitor including a fifth capacitor, wherein a writing and a read-out operation of said fifth capacitor is executed at a frequency having a predetermined period,
wherein said first and socond inversion-type switched-capacitors and said first and second noninvernsion-type switched-capacitors are controlled so that read-out operation of said first, second, third and fourth capacitors is executed at a frequency having a different period from said predetermined period, so that each writing operation of said first, second, third and fourth capacitors is executed at a frequency having a different period from said predetermined period, so that the writing operation of said first capacitor is executed at a different timing from that of said second capacitor, so that the writing operation of said third capacitor is executed at a different timing from that of said fourth capacitor, so that the writing operation of said first capacitor is executed at a substantially equal timing to that of said third capacitor, so that the writing operation of said second capacitor is executed at a substantially equal timing to that of said fourth capacitor, so that the read-out operation of said first capacitor is executed at a substantially equal timing to that of said fourth capacitor, so that the read-out operation of said second capacitor is executed at a substantially equal timing to that of said third capacitor, and so that each read-out operation of said third and fourth capacitors is executed at a substantially equal timing to the writing operation thereof.

2. A semiconductor integrated circuit according to claim 1, wherein said first and second inversion-type switched-capacitors and said first and second noninversion-type switched-capacitors are controlled so that each read-out operation of said first, second, third and fourth capacitors is executed at a frequency having a period which is substantially two times as long as said predetermined period, and so that each writing operation of said first, second, third and fourth capacitors is executed at a frequency having a period which is substantially two times as long as said predetermined period.

3. A semiconductor integrated circuit comprising:
an input node for receiving an input signal;
operational amplifier means having an input terminal and an output terminal;
a first inversion-type switched-capacitor and second inversion-type switched-capacitor that are coupled in parallel between said input node and said input terminal, wherein said first inversion-type switched-capacitor includes a first capacitor and said second inversion-type switched-capacitor includes a second capacitor having a substantially equal capacitance to said first capacitor, and wherein a charge proportional to the input signal is written into each of said first and second capacitors in a writing operation thereof, and wherein each of said first and second capacitors provides a charge of opposite polarity to that written therein to said input terminal in a read-out operation thereof; and
a first noninversion-type switched-capacitor coupled between said input node and said input terminal, said first noninversion-type switched-capacitor including a third capacitor, wherein a charge proportional to the input signal is written into said third capacitor in a writing operation thereof and said third capacitor provides a charge of the same polarity as that written therein to said input terminal in a read-out operation thereof, wherein said writing operation of said third capacitor is executed at a substantially equal timing to the read-out operation thereof, and wherein the read-out operation of said third capacitor is exeucted at a frequency having a predetermined period,
wherein said first and second inversion-type switched-capacitors are controlled so that read-out operation of said first and second capacitors is executed at a frequency having a different period from said predetermined period, so that each writing operation of said first and second capacitors is executed at a frequency having a different period from said predetermined period, so that the writing operation of said first capacitor is executed at a different timing from that of said second capacitor, and so that the read-out operation of said first capacitor is executed at a different timing from that of said second capacitor.

4. A semiconductor integrated circuit according to claim 3, wherein said first and second inversion-type switched-capacitors are controlled so that the read-out operation of said first capacitor is executed at a substantially equal timing to the writing operation of said second capacitor, and so that the writing operation of said first capacitor is executed at a substantially equal timing to the read-out operation of said second capacitor.

5. A semiconductor integrated circuit according to claim 4, wherein said first and second inversion-type switched-capacitors are controlled so that each read-out operation of said first and second capacitors is executed at a frequency having a period which is substantially two times as long as said predetermined period, and so that each writing operation of said first and second capacitors is executed at a frequency having a period which is substantially two times as long as said predetermined period.

6. A semiconductor integrated circuit according to claim 5, further comprising a second noninversion-type switch-capacitor coupled between said input terminal and said output terminal, said second noninversion-type switched-capacitor including a fourth capacitor, wherein a writing and a read-out operation of said fourth capacitor is executed at a frequency having said predetermined period.

7. A semiconductor integrated ciruict according to claim 6, further comprising a fifth capacitor coupled between said input terminal and said output terminal.

8. A semiconductor integrated circuit comprising:
an input node for receiving an input signal;
operational amplifier means having an input terminal and an output terminal;
a first capacitor coupled between said input terminal and said output terminal;
a first inversion-type switched-capacitor and a second inversion-type switched-capacitor that are coupled in parallel between said input node and said input terminal, wherein said first inversion-type switched-capacitor includes a second capacitor and said second inversion-type switched-capacitor includes a third capacitor having a substantially equal capacitance to said second capacitor, and wherein a charge proportional to the input signal is written into each of said second and third capacitors in a writing operation thereof, and wherein each of said second and third capacitors provides a charge of opposite polarity to that written therein to said input terminal in a read-out operation thereof; and
a noninversion-type switched-capacitor coupled between said input node and said input terminal, said noninversion-type switched-capacitor including a fourth capacitor, wherein a charge proportional to the input signal is written into said fourth capacitor in writing operation thereof, and wherein said fourth capacitor provides a charge of the same polarity as that written therein to said input terminal in a read-out operation thereof, wherein said writing operation of said fourth capacitor is executed at a substantially equal timing to the read-out operation thereof, and wherein the read-out operation of said fourth capacitor is executed at a frequency having a predetermined period, wherein said first and second invernsion-type switched-capacitors are controlled so that each read-out operation of said second and third capacitors is executed at a frequency having a different period from said predetermined period, so that each writing operation of said second and third capacitors is executed at a frequency having a different period from said predetermined period, so that the wrwiting operation of said second capacitor is executed at a different timing from that of said third capacitor, and so that the read-out operation of said second capacitor is executed at a different timing from that of said third capacitor.

9. A semiconductor integrated circuit according to claim 8, wherein said first and second inversion-type switched-capacitors are controlled so that the read-out operation of said second capacitor is executed at a substantially equal timing to the writing operation of said third capacitor, and so that the writing operation of said second capacitor is executed at a substantially equal timing to the read-out operation of said third capacitor.

10. A semiconductor integrated circuit according to claim 9, wherein said first and second inversion-type switched-capacitors are controlled so that each read-out operation of said second and third capacitors is executed at a frequency having a period which is substantially two times as long as said predetermined period, and so that each writing operation of said second and third capacitors is executed at a frequency having a period which is substantially two times as long as said predetermined period.

11. A semiconductor integrated circuit comprising:
an input node for receiving an input signal;
operational amplifier means having an input terminal and an output terminal;
a first inversion-type switched-capacitor and a second inversion-type switched-capacitor that are coupled in parallel between said input node and said input terminal, wherein said first inversion-type switched-capacitor includes a first capacitor and a first pair of switches, wherein said second inversion-type switched-capacitor includes a second pair of switches and a second capacitor having a substantially equal capacitance to said first capacitor, and wherein a charge proportional to the input signal is written in each of said first and second capacitors when said first and second pairs of switches are in a first predetermined switching condition in a writing operation of said first and second capacitors, and wherein each of said first and second capacitors provides a charge of opposite polarity to that written therein to said input terminal when said first and second pairs of switches are in a second predetermined switching condition in a read-out operation of said first and second capacitors;
a first noninversion-type switched-capacitor and a second noninversion-tyep switched-capacitor that are coupled in parallel between said input node and said input terminal, wherein said first noninversion-type switched-capacitor includes a third capacitor and a third pair of switches and said second noninversion-type switch-capacitor includes a fourth pair of switches and a fourth capacitor having a substantially equal capacitance to said third capacitor, and wherein a charge proportional to the input signal is written into each of said third and fourth capacitors when said third and fourth pairs of switches are in a first predetermined switching condition in a writing operation of said third and foruth capacitors, and wherein each of said third and fourth capacitors provides a charge of the same polarity as that written therein to said input terminal when said third and fourth pairs of switches are in said first predetermined switching condition in a read-out operation of said third and fourth capacitors; and
a third noninversion-type switched capacitor coupled between said input terminal and said output terminal, said third noninversion-type switched-capacitor including a fifth capacitor and a fifth pair of switches, wherein a writing and a read-out operation of said fifth capacitor is executed by operating said fifth pair of switches at a frequency having a predetermined period,
wherein switching operations of said first and second pairs of switches of said first and second inversion-type switch-capacitors and switching operations of said third and fourth pairs of switches of said first and second noninversion-type switched-capacitors are controlled so that read-out operation of said first, second, third and fourth capacitors is executed at a frequency having a different period from said predetermined period, so that each writing operation of said first, second, third and fourth capacitors is executed at a frequency having a different period from said predetermined period, so that the writing operation of said first capacitor is executed at a different timing from that of said second capacitor, so that the writing operation of said third capacitor is executed at a different timing from that of said fourth capacitor, so that the writing operation of said first capacitor is executed at a substantially equal timing to that of said third capacitor, so that the writing operation of said second capacitor is executed at a substantially equal timing to that of said fourth capacitor, so that the read-out operation of said first capacitor is executed at a substantially equal timing to that of said fourth capacitor, so that the read-out operation of said second capacitor is excuted at a substantially equal timing to that of said third capacitor, so that each read-out operation of said third and fourth capacitors is executed at a substantially equal timing to the writing operation thereof, and so that each read-out operation of said first, second, third and fourth capacitors is executed at a frequency having a period which is substantially two times as long as said predetermined period, and so that each writing operation of said first, second, third and fourth capacitors is executed at a frequency having a period which is substantially two times as long as said predetermined period.

12. A semiconductor integrated circuit according to claim 11, wherein each of said first, second, third, fourth and fifth pairs of switches is comprised of a pair of field-effect transistors.

13. A semiconductor integrated circuit according to claim 11, further comprising a sixth capacitor coupled between said input terminal and said output terminal.

14. A semiconductor integrated circuit comprising:
an input node for receiving an input signal;
operational amplifier means having an input terminal and an output terminal;

a first inversion-type switched-capacitor and a second inversion-type switched-capacitor that are coupled in parallel between said input node and said input terminal, wherein said first inversion-type switch-capacitor includes a first capacitor and a first pair of switches, wherein said second inversion-type switched-capacitor includes a second pair of switches and a second capacitor having a substantially equal capacitance to said first capacitor, and wherein a charge proportional to the input signal is written into each of said first and second capacitors when said first and second pairs of switches are in a first predetermined switching condition in a writing operation of said first and second capacitors, and wherein each of said first and second capacitors provides a charge of opposite polarity to that written therein to said input terminal when said first and second pairs of switches are in a second predetermined switching condition in a read-out operation of said first and second capacitors; and a first noninversion-type switched-capacitor coupled between said input node and said input terminal, said first noninversion-type switched-capacitor including a third capacitor and a third pair of switches, wherein a charge proportional to the input signal is written into said third capacitor when said third pair of switches is in a first predetermined switching position during a writing operation of said third capacitor, and wherein said third capacitor provides a charge of the same polarity as that written therein to said input terminal when said third pair of switches are in said first predetermined switching position in a read-out operation of said third capacitor, wherein said writing operation of said third capacitor is executed at a substantially equal timing to the read-out operation thereof, and wherein the read-out operation of said third capacitor is executed at a frequency having a predetermined period, wherein switching operations of said first and second pairs of switches of said first and second inversion-type switched-capacitors are controlled so that each read-out operation of said first and second capaciotrs is executed at a frequency having a different period from said predetermined period, so that each writing operation of said first and second capacitors is executed at a frequency having a different period from said predetermined period, so that the writing operation of said first capacitor is executed at a different timing form that of said second capacitor, so that the read-out operation of said first capacitor is executed at a different timing form that of said second capacitor, so that the read-out operation of said first capacitor is executed at a substantially equal timing to the writing operation of said second capacitor, so that the writing operation of said first capacitor is executed at a substantially equal timing to the read-out operation of said second capacitor, so that each read-out operation of said first and second capacitors is executed at a frequency having a period which is substantially two times as long as said predetermined period, and so that each writing operation of said first and second capacitors is executed at a frequency having a period which is substantially two times as long as said predetermined period, said semiconducotr integrated circuit further comprising a second noninversion-type swiwtched-capacitor coupled between said input terminal and said output terminal, said second noninversion-type switched-capacitor including a fourth capacitor and a fourth pair of switches, wherein a writing and a read-out operation of said fourth capacitor is executed by operating said fourth pair of switches at a frequency having said predetermined period.

15. A semiconductor integrated circuit according to claim 14, further comprising a fifth capacitor coupled between said input terminal and said output terminal.

16. A semiconductor integrated circuit according to claim 14, wherein each of said first, second, third and fourth pairs of switches is comprised of a pair of field-effect transistors.

17. A semiconductor integrated circuit comprising:
an input node for receiving an input signal;
operational amplifier means having an input terminal and an output terminal;
a first capacitor coupled between said input terminal and said output terminal;
a first inversion-type switched-capacitor and a second inversion-type switched-capacitor that are coupled in parallel between said input node and said input terminal, wherein said first inversion-type switched-capacitopr includes a second capacitor and a first pair of switches, wherein said second inversion-type switched-capacitor includes a second pair of switches and a third capacitor having a substantially equal capacitance to said second capacitor, and wherein a charge proportional to the input signal is written into each of said second and third capacitors when said ifrst and second pairs of switches are in a first predetermined switching condition in a writing operation of said second and third capacitors, and wherein each of said second and third capacitors provides a charge of opposite polarity to that written therein to said input terminal when said first and second pairs of switches are in a second predetermined switching position in a read-out operation of said second and third capacitors;
a noninversion-type switched-capacitor coupled between said input node and said input terminal, said noninversion-type switched-capacitor including a fourth capacitor and a third pair of switches, wherein a charge proportional to the input signal is written into said fourth capacitor when said third pair of switches is in a first predetermined switching position in a writing operation of said fourth capaciotr, and wherein said fourth capacitor provides a charge of the same polarity as that written therein to said input terminal when said third pair of switches are in said first predetermined switching position in a read-out operation of said fourth capacitor, wherein said writing operation of aid fourth capaciotr is executed at a substantially equal timing to the read-out operation thereof, and wherein the read-out operation of said fourth capacitor is excuted at a frequency having a predetermined period,
wherein switching operations of said first and second pairs of switches of said first and second inversion-type switched-capaciotrs are controlled so that each read-out operation of said second and third capaciotrs is executed at a frequency having a different period from said predetermined period, so that each writing operation of said second and third capacitors is excuted at a frequency having a different period from said predetermined period, so that the writing operation of said second capacitor is executed at a different timing from that of said third capacitor, so that the read-out operation of said second capacitor is executed at a different timing from that of said third capacitor, so that the read-out operation of said second cpaacitor is executed at a substantially equal timing to the writing operation of said third capacitor, so that the writing operation of said second capacitor is executed at a substantially equal timing to the read-out operation of said third capacitor, so that each read-out operation of said second and third capaciotrs is executed at a frequency having a period which is substantially two times as long as said predetermined period, and so that each writing operation of said second and third capaciotrs is executed at a frequency having a period which is substantially two times as long as said predetermined period.

18. A semiconductor integrated circuit according to claim 17, wherein each of said first, second and third pairs of switches is comprised of a pair of field-effect transistors.

* * * * *